United States Patent [19]

Countryman et al.

[11] Patent Number: 5,463,353

[45] Date of Patent: Oct. 31, 1995

[54] RESISTORLESS VCO INCLUDING CURRENT SOURCE AND SINK CONTROLLING A CURRENT CONTROLLED OSCILLATOR

[75] Inventors: Roger S. Countryman, Austin; Jose Alvarez, Leander, both of Tex.

[73] Assignee: Motorola, Inc., Schaumburg, Ill.

[21] Appl. No.: 300,238

[22] Filed: Sep. 6, 1994

[51] Int. Cl.[6] .............................. H03K 3/03; H03K 3/354; H03L 7/099

[52] U.S. Cl. ..................... 331/2; 331/8; 331/10; 331/17; 331/25; 331/34; 331/57; 331/177 R

[58] Field of Search .................... 331/2, 8, 10, 17, 331/25, 34, 57, 177 R

[56] References Cited

U.S. PATENT DOCUMENTS

| | | | |
|---|---|---|---|
| 4,803,705 | 2/1989 | Gillingham et al. | 375/120 |
| 4,818,950 | 4/1989 | Ranger | 328/155 |
| 5,144,156 | 9/1992 | Kawasaki | 331/17 X |
| 5,357,217 | 10/1994 | Marchesi et al. | 331/57 |

OTHER PUBLICATIONS

"A Design of Automatically Tunable Active MOSFET–RC Filters Using a Single–Ended Circuit Structure," Inoue, et al,; Electronics and Communications in Japan, Part 3, vol. 73, No. 10, 1990, pp. 1–12.

Primary Examiner—Siegfried H. Grimm
Attorney, Agent, or Firm—Lee E. Chastain

[57] ABSTRACT

A voltage controlled oscillator (VCO) 16 generates a periodic clock signal without the use any resistors. Therefore, the described VCO may be advantageously incorporated into devices fabricated with semiconductor processes without special resistor-base design constraints.

18 Claims, 4 Drawing Sheets

RESISTORLESS VCO INCLUDING CURRENT SOURCE AND SINK CONTROLLING A CURRENT CONTROLLED OSCILLATOR

RELATED APPLICATION

This application is related by subject matter to an application for U.S. Patent entitled Phase Locked Loop with Low Power Feedback Path and Method of Operation, attorney docket number SC-02026A, to Sanchez et al., filed concurrently herewith. (U.S. Ser. No. 08/300,904, which is now U.S. Pat. No. 5,428,317).

FIELD OF THE INVENTION

The present invention generally relates to digital control systems, and more specifically to a voltage controlled oscillator.

BACKGROUND OF THE INVENTION

Voltage controlled oscillators (VCOs) are a class of devices that generate a periodic clock signal responsive to an input voltage. VCOs are often used in phase locked loops (PLLs) to generate a clock signal that is dynamically phase and frequency compared to an input reference clock signal. Typically, the output of a charge pump generates the input voltage to a VCO.

In known designs, VCOs and charge pumps are connected via a common node that in turn is connected to a voltage supply through a resistor and a capacitor in series. The voltage supply is typically ground. The charge pump alternately sources and sinks current to this common node responsive to the PLL's phase and frequency comparison. The resistor and capacitor thereby convert this current sourcing and sinking to a voltage level with alternating and direct components.

VCOs are frequently fabricated on a silicon substrate and integrated with other devices such as data processors, embedded controllers, digital signal processors, etc. Unfortunately, semiconductor processes are not able to fabricate resistors with a high degree of precision (value of resistance) or accuracy (repeatability of resistance over several devices). Therefore, systems incorporating known VCOs must be designed to operate with the range of resistances possible with a particular process.

BRIEF DESCRIPTION OF THE DRAWINGS

The features and advantages of the present invention will be more clearly understood from the following detailed description taken in conjunction with the accompanying FIGURES where like numerals refer to like and corresponding parts and in which.

DETAILED DESCRIPTION OF A PREFERRED EMBODIMENT

Figure 1:
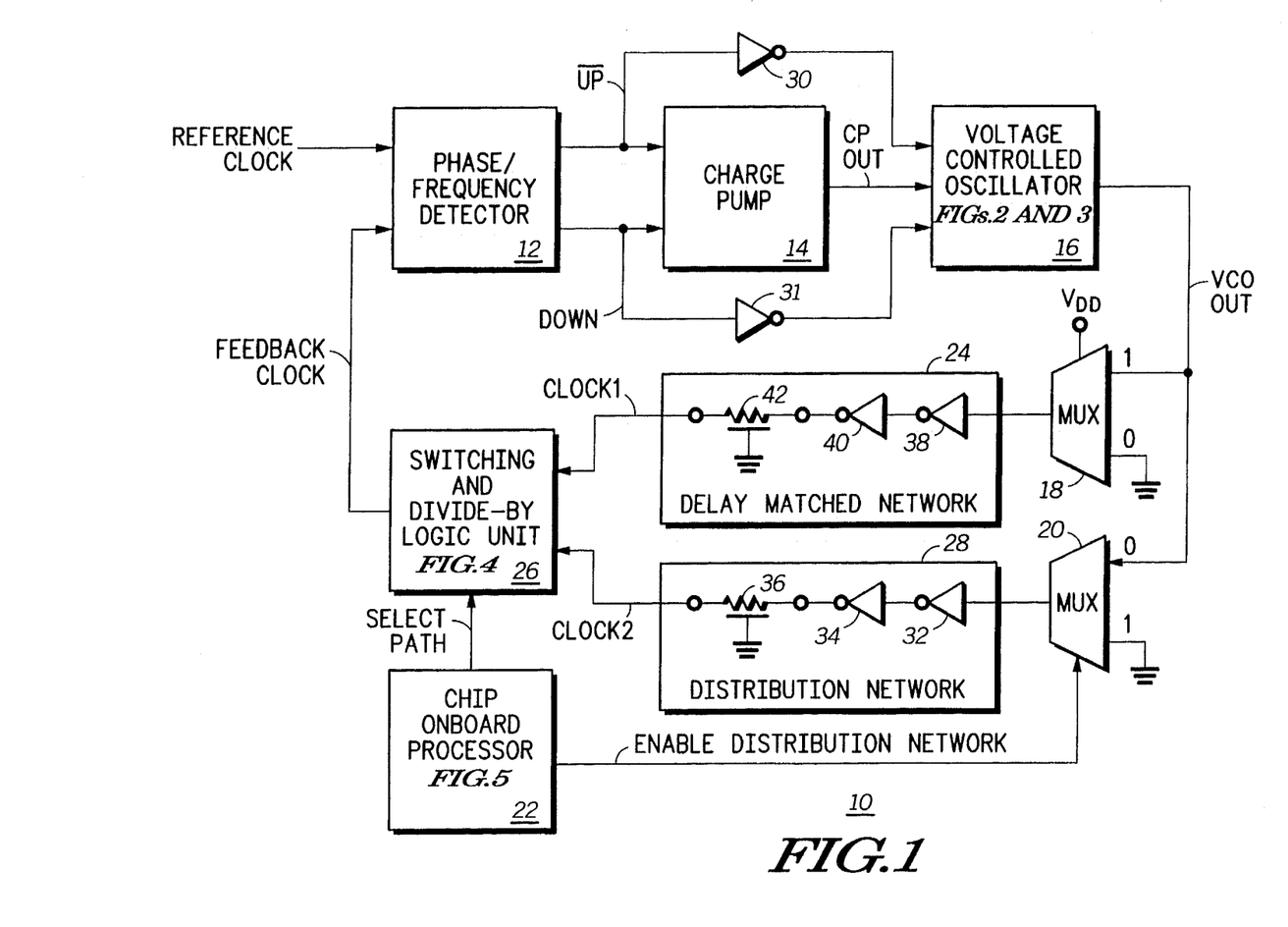
FIG. 1 depicts a block diagram of a phase locked loop constructed in accordance with the present invention.

FIG. 1 depicts a block diagram of a phase locked loop (hereafter "PLL") 10 constructed in accordance with the present invention. A voltage controlled oscillator within PLL 10 generates a periodic clock signal to which an input REFERENCE CLOCK signal is dynamically phase and frequency compared. The described voltage controlled oscillator does not require any resistors. Therefore, the described voltage controlled oscillator may be advantageously incorporated into devices fabricated with semiconductor processes without special resistor-base design constraints.

Continuing with FIG. 1. PLL 10 has a phase/frequency detector 12, a charge pump 14, and a voltage controlled oscillator (hereafter simply "VCO") 16 connected in series. The output of VCO 16 (labeled "VCO OUT") is connected to a first input of a first 2:1 multiplexer (labeled "MUX") 18 and to a first input of a second 2:1 multiplexer (labeled "MUX") 20. A second input of first multiplexer 18 and a second input of second multiplexer 20 both receive a constant voltage level, here ground. The output of first multiplexer 18 always passes VCO OUT. The output of second multiplexer 20 passes one of its outputs responsive to a control signal ENABLE DISTRIBUTION NETWORK output by a chip onboard processor (hereafter "COP") 22 as described below.

The output of first multiplexer 18 is fed to an input of a delay matching network 24. An output of delay matching network 24 (labeled CLOCK1") is connected to a first input of a switching and divide-by logic unit 26. The output of second multiplexer 20 is fed to an input of a distribution network 28. An output of distribution network 28 (labeled CLOCK2") is connected to a second input of switching and divide-by logic unit 26. Switching and divide-by logic unit 26 connects its output (labeled "FEEDBACK CLOCK") to phase/frequency detector 12 to close one feedback path in PLL 10. Switching and divide-by logic unit 26 selects one of its two inputs responsive to a control signal SELECT PATH output by COP 22. Switching and divide-by logic unit 26 also performs a divide-by function to produce various ratios of CLOCK1:REFERENCE CLOCK or CLOCK2:REFERENCE CLOCK.

General Operation

PLL 10 generates an output clock signal, CLOCK2, that has a predetermined phase and frequency relationship to an input signal REFERENCE CLOCK. In particular, PLL 10 dynamically adjusts the phase and frequency of the output clock signal to match the phase and frequency of the reference clock signal or adjusts the phase and frequency of the output clock signal to match the phase and frequency of a multiple of the reference clock signal.

Phase/frequency detector 12 receives the two clock signals and generates $\overline{UP}$ and DOWN control signals. If the falling edge of FEEDBACK CLOCK occurs after the falling edge of REFERENCE CLOCK, then phase/frequency detector 12 asserts control signal $\overline{UP}$ to charge pump 14. An inverter 30 reverses the polarity of control signal $\overline{UP}$ before inputting it to VCO 16. Conversely, if the falling edge of FEEDBACK CLOCK occurs before the falling edge of REFERENCE CLOCK, then phase/frequency detector 12 asserts control signal DOWN to charge pump 14. An inverter 31 reverses the polarity of control signal DOWN before inputting it to VCO 16.

Charge pump 14 charges or discharges a node (CP OUT) responsive to the output signals $\overline{\text{UP}}$ and DOWN of phase/frequency detector 12. Charge pump 14 charges the node when the $\overline{\text{UP}}$ control signal is asserted by sourcing an electrical current to the node. Charge pump 14 discharges the node when the DOWN control signal is asserted by sinking an electrical current from the node. One embodiment of the disclosed invention incorporates a charge pump 14 that has a programmable pump current. The pump current is the current that charges or discharges the node described above. A variable current allows charge pump 14 to behave consistently over a range of divide-by settings of switching and divide-by logic unit 26. Allowed application for U.S. Patent entitled "A Charge Pump with a Programmable Pump Current and System," U.S. Ser. No. 08/070,186, filed Jun. 2, 1993, now U.S. Pat. No. 5,362,990 and incorporated herein by reference, describes a charge pump which may be incorporated into PLL 10.

VCO 16 generates a periodic clock signal, VCO OUT, responsive to the voltage present on the node of charge pump 14 and to the control signals UP and $\overline{\text{DOWN}}$. VCO 16 is described below in connection with FIGS. 2 and 3.

Clock signal VCO OUT is then distributed by distribution network 28 to all the clocked latches of the circuit incorporating or otherwise using PLL 10. In the depicted embodiment, PLL 10 is incorporated into a reduced instruction set computing ("RISC") data processor (not shown). Approximately seven thousand clocked latches in this data processor receive CLOCK2 through three hundred instances of switching and divide-by logic unit 26. Two inverters 32 and 34 buffer the output of second multiplexer 20 before routing VCO OUT through an "H-tree," depicted as a distributed resistance and capacitance ("RC") 36. An H-tree is a generally symmetric conductive network fabricated in the shape of the letter H. CLOCK2 is input to the center of the H's cross-member and propagates outward to all three hundred instances of switching and divide-by logic unit 26 evenly. The four arms of the H each have a smaller H network. These four smaller H's each have four even smaller H's at their four corners, etc. The H-tree in the depicted embodiment contains approximately three-hundred "leaves." Each of these leaves is connected to a switching and divide-by logic unit 26 (only one is depicted). One of these divide-by logic units, physically close to phase/frequency detector 12, also receives the output of delay matching network 24. The other switching and divide-by logic units 26 receive a constant voltage level in place of CLOCK1.

Clock signal VCO OUT is also "distributed" by delay matching network 24 to switching and divide-by logic unit 26. Two inverters 38 and 40 buffer the output of first multiplexer 18 in delay matching network 24 before routing VCO OUT through a distributed RC 42. As described below, delay matching network delays the propagation of VCO OUT through it an amount equal to the propagation delay caused by distribution network 28. However, inverters 38 and 40 are an order of magnitude smaller than inverters 32 and 34. Therefore, the power requirements of PLL 10 when only delay matched network 24 is enabled are approximately an order of magnitude less than when both networks are enabled.

Resistorless Voltage Controlled Oscillator

Figure 2:
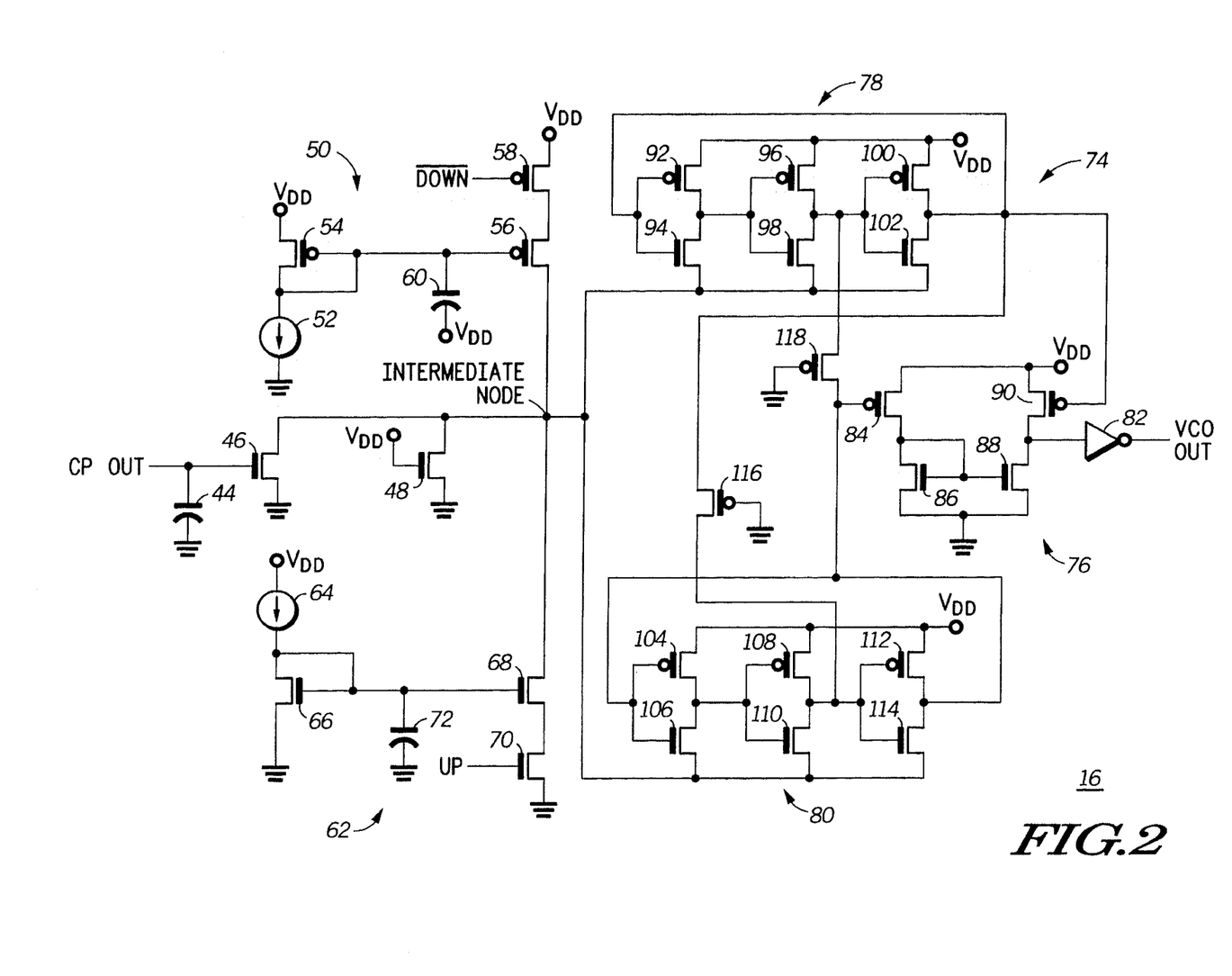
FIG. 2 depicts a schematic diagram of a first embodiment of the voltage controlled oscillator illustrated in FIG. 1.

FIG. 2 depicts a schematic diagram of a first embodiment of VCO (hereafter "first VCO") 16 illustrated in FIG. 1. A first terminal of a capacitor 44 is connected to the output node, CP OUT, of charge pump 14. A second terminal of capacitor 44 receives a first voltage supply, ground. (Capacitor 44 is often not considered part of VCO 16.) The node CP OUT is also connected to the control electrode of an n-channel transistor 46. A first current electrode of transistor 46 receives the first voltage supply, ground. A second current electrode is connected to an intermediate node. A first current electrode of a small n-channel transistor 48 is connected to the intermediate node. A second current electrode of transistor 48 receives the first voltage supply, ground. A control electrode of transistor 48 receives a second voltage supply, $V_{DD}$.

A current sourcing circuit 50 sources current to the intermediate node responsive to the control signal $\overline{\text{DOWN}}$ output by phase/frequency detector 12 via inverter 31. In particular, a first terminal of a constant current source 52 receives the first voltage supply, ground. A second terminal of constant current source 52 is connected to a first current electrode and to a control electrode of a p-channel transistor 54. A second current electrode of transistor 54 receives the second voltage supply, $V_{DD}$. The control electrode of transistor 54 is also connected to a control electrode of a p-channel transistor 56. A first current electrode of transistor 56 is connected to the intermediate node. A second current electrode of transistor 56 is connected to a first current electrode of a p-channel transistor 58. A second current electrode of transistor 58 receives the second voltage supply, $V_{DD}$. A control electrode of transistor 58 receives the control signal $\overline{\text{DOWN}}$. Finally, a first terminal of a capacitor 60 receives the second voltage supply, $V_{DD}$. A second terminal of capacitor 60 is connected to the control electrodes of transistors 54 and 56.

A current sinking circuit 62 sinks current from the intermediate node responsive to the control signal UP output by phase/frequency detector 12 via inverter 30. In particular, a first terminal of a constant current source 64 receives the second voltage supply, $V_{DD}$. A second terminal of constant current source 64 is connected to a first current electrode and to a control electrode of an n-channel transistor 66. A control electrode of transistor 66 receives the first voltage supply, ground. The control electrode of transistor 66 is also connected to a control electrode of an n-channel transistor 68. A first current electrode of transistor 68 is connected to the intermediate node. A second current electrode of transistor 68 is connected to a first current electrode of an n-channel transistor 70. A second current electrode of transistor 70 receives the first voltage supply, ground. A control electrode of transistor 70 receives the control signal UP. Finally, a first terminal of a capacitor 72 receives the first voltage supply, ground. A second terminal of capacitor 72 is connected to the control electrodes of transistors 66 and 68.

The intermediate node is connected to a current controlled oscillator 74. Current controlled oscillator 74 transforms the current at the intermediate node into the periodic clocking signal VCO OUT. In particular, a differential stage amplifier 76 receives the partial-rail outputs of a first ring oscillator 78 and a second ring oscillator 80. First and second ring oscillators 78 and 80 are cross-coupled to generate complementary clock signals. An input of an inverter 82 receives the full voltage-rail output of differential stage amplifier 76. An output of inverter 82 generates VCO OUT.

Continuing with differential stage amplifier 76, a first current electrode of a p-channel transistor 84 receives the second voltage supply, $V_{DD}$. A second current electrode of transistor 84 is connected to a first current electrode and to a control electrode of an n-channel transistor 86. A second current electrode of transistor 86 receives the first voltage supply, ground. The control electrode of transistor 86 is also connected to a control electrode of an n-channel transistor 88. A first current electrode of transistor 88 is connected to the input of inverter 82 and to a first current electrode of a p-channel transistor 90. A second current electrode of transistor 88 receives the first voltage supply, ground. A second current electrode of transistor 90 receives the second voltage supply, $V_{DD}$.

Continuing with first ring oscillator 78, a p-channel transistor 92 and an n-channel transistor 94 form a first inverter of an odd number of serially connected inverting stages. A first current electrode of transistor 92 receives the second voltage supply, $V_{DD}$. A second current electrode of transistor 92 is connected to a first current electrode of transistor 94. A second current electrode of transistor 94 receives the voltage present at the intermediate node. The second current electrode of transistor 92 and the first current electrode of transistor 94 are connected to the control electrodes of a p-channel transistor 96 and an n-channel transistor 98. Transistor 96 and transistor 98 form a second inverter. A first current electrode of transistor 96 receives the second voltage supply, $V_{DD}$. A second current electrode of transistor 96 is connected to a first current electrode of transistor 98. A second current electrode of transistor 98 receives the voltage present at the intermediate node. The second current electrode of transistor 96 and the first current electrode of transistor 98 are connected to the control electrodes of a p-channel transistor 100 and an n-channel transistor 102. Transistor 100 and transistor 102 form a third inverter. A first current electrode of transistor 100 receives the second voltage supply, $V_{DD}$. A second current electrode of transistor 100 is connected to a first current electrode of transistor 102. A second current electrode of transistor 102 receives the voltage present at the intermediate node. The second current electrode of transistor 100 and the first current electrode of transistor 102 are connected to the control electrodes of transistors 92, 94 and 90 (differential stage amplifier 76).

Continuing with second ring oscillator 80, a p-channel transistor 104 and an n-channel transistor 106 form a first inverter of an odd number of serially connected inverting stages. A first current electrode of transistor 104 receives the second voltage supply, $V_{DD}$. A second current electrode of transistor 104 is connected to a first current electrode of transistor 106. A second current electrode of transistor 106 receives the voltage present at the intermediate node. The second current electrode of transistor 104 and the first current electrode of transistor 106 are connected to the control electrodes of a p-channel transistor 108 and an n-channel transistor 110. Transistor 108 and transistor 110 form a second inverter. A first current electrode of transistor 108 receives the second voltage supply, $V_{DD}$. A second current electrode of transistor 108 is connected to a first current electrode of transistor 110. A second current electrode of transistor 110 receives the voltage present at the intermediate node. The second current electrode of transistor 108 and the first current electrode of transistor 110 are connected to the control electrodes of a p-channel transistor 112 and an n-channel transistor 114. Transistor 112 and transistor 114 form a third inverter. A first current electrode of transistor 112 receives the second voltage supply, $V_{DD}$. A second current electrode of transistor 112 is connected to a first current electrode of transistor 114. A second current electrode of transistor 114 receives the voltage present at the intermediate node. The second current electrode of transistor 112 and the first current electrode of transistor 114 are connected to the control electrodes of transistors 104, 106 and 84 (differential stage amplifier 76).

Two p-channel transistors 116 and 118 ensure that the output of first ring oscillator 78 and second ring oscillator 80 are 180° out-of-phase with respect to each other. In particular, a first current electrode of transistor 116 is connected to the second current electrode of transistor 100 and to the first current electrode of transistor 102. A second current electrode of transistor 116 is connected to the second current electrode of transistor 108 and to the first current electrode of transistor 110. A control electrode of transistor 116 receives the first voltage supply, ground. A first current electrode of transistor 118 is connected to the second current electrode of transistor 112 and to the first current electrode of transistor 114. A second current electrode of transistor 118 is connected to the second current electrode of transistor 96 and to the first current electrode of transistor 98. A control electrode of transistor 118 receives the first voltage supply, ground.

In operation, charge pump 14 sources and sinks current at CP OUT responsive to the output control signals of phase/frequency detector 12. Capacitor 44 removes the alternating current ("AC") component of this signal, producing a voltage at the control electrode of transistor 46. This voltage varies slowly as a function of time due to the relatively large size of capacitor 44. Transistor 46 transmits this direct current ("DC") voltage to the intermediate node as a current. The DC component voltage at CP OUT thereby causes current controlled oscillator 74 to regulate the frequency of VCO OUT by controlling the voltage difference across the voltage supply rails of first ring oscillator 78 and second ring oscillator 80. In general, the greater the voltage difference across the first ring oscillator 78 and the second ring oscillator 80, the greater the rate of oscillation of each. Current sourcing circuit 50 and current sinking circuit 62 transmit the alternating current ("AC") voltage component of the output of phase/frequency detector 12 directly to the intermediate node. These small current changes cause current controlled oscillator 74 to vary the frequency of VCO OUT for only brief intervals of time, thereby changing the phase of VCO OUT.

Figure 3:
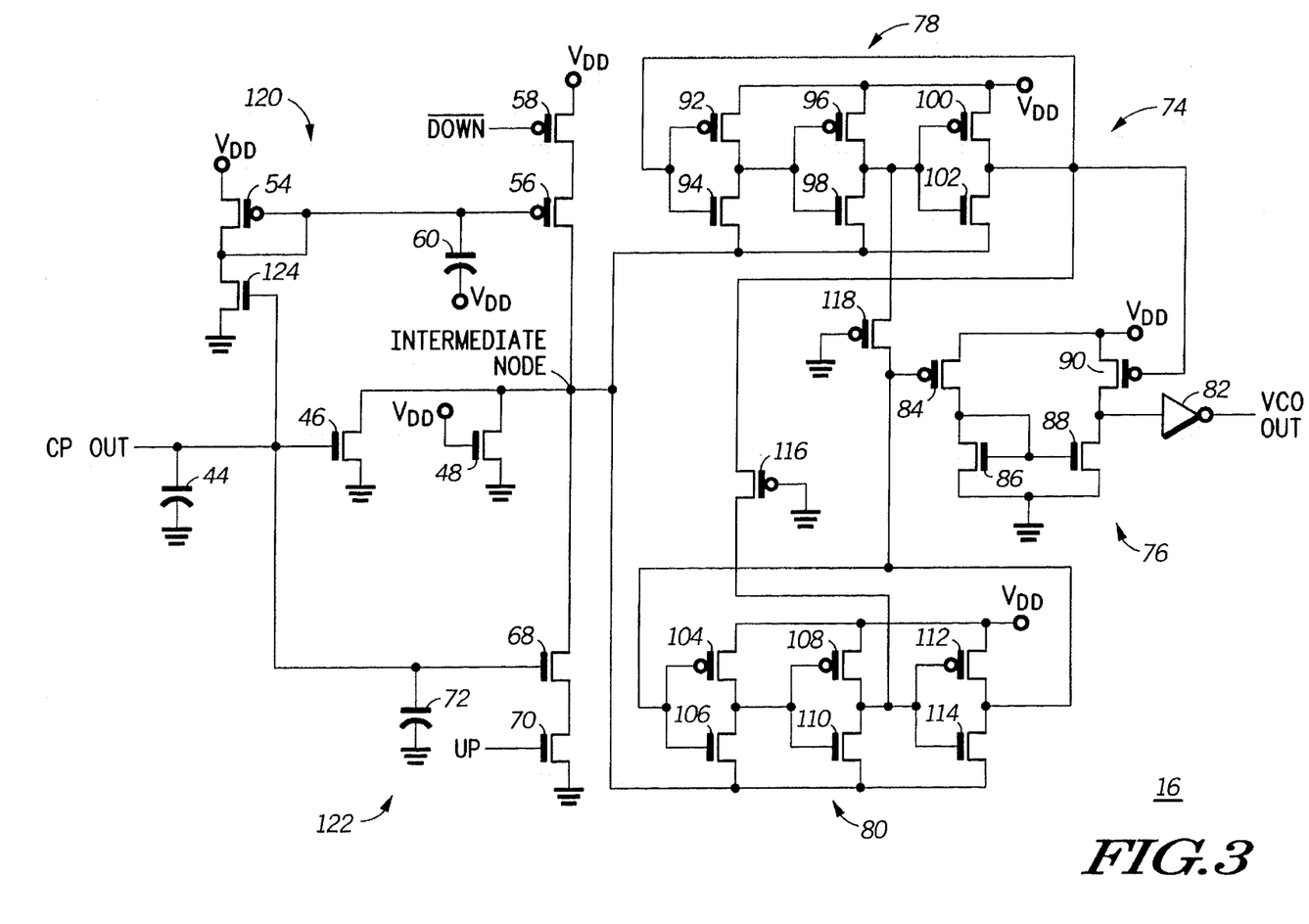
FIG. 3 depicts a schematic diagram of a second embodiment of the voltage controlled oscillator illustrated in FIG. 1.

FIG. 3 depicts a schematic diagram of a second embodiment of VCO (hereafter "second VCO") 16 illustrated in FIG. 1. Second VCO 16 is identical to first VCO 16 with only a few exceptions. In particular, a current sourcing circuit 120 sources current to the intermediate node responsive to the control signal $\overline{\text{DOWN}}$ and the voltage at CP OUT. Similarly, a current sinking circuit 122 sinks current from the intermediate node responsive to the control signal UP and the voltage at CP OUT. The phase correction generated by the combination of current sourcing circuit 120, process-compensated current sinking circuit 122, and current controlled oscillator 74 is relatively immune to variations caused by manufacturing processes.

Continuing with current sourcing circuit 120, a first current electrode of an n-channel transistor 124 receives the first voltage supply, ground. A second current electrode of transistor 124 is connected to the first current electrode and to the control electrode of transistor 54. A control electrode of transistor 124 is connected to CP OUT. There is no need for constant current source 52.

Continuing with current sinking circuit 122, the control electrode of transistor 68 is connected directly to CP OUT. There is no need for constant current source 64 or transistor 66.

The operation of the second VCO 16 is substantially similar to the first VCO 16. In second VCO 16, current sourcing circuit 120 and current sinking circuit 122 do not use a constant current generator. Instead, these circuits use the voltage at CP OUT as their "current generator." This voltage varies as a function of the output of charge pump 14 and as a function of manufacturing processes used to fabricate PLL 10. These latter differences are uncontrollable to a certain extent.

The manufacturing processes used to fabricate second VCO 16 will create VCOs having a range of gains. For instance, one lot of VCOs may result in "faster" than average transistors. Fast transistors will increase the gain of current controlled oscillator 16, i.e. a smaller than average input voltage at the intermediate node or a larger than average input voltage at CP OUT will produce a certain response from current controlled oscillator 74. Conversely, another lot of VCOs may result in "slower" than average transistors. Slower transistors will decrease the gain of current controlled oscillator 16, i.e. a larger than average input voltage at the intermediate node or a smaller than average input voltage at CP OUT will produce the certain response from current controlled oscillator 74.

The performance of second VCO 16 is more consistent over the range of manufacturing variations. In the case of a "fast process," the higher than expected voltage at CP OUT will cause current sourcing circuit 120 and current sinking circuit 122 to source and sink more current for a particular phase adjustment. In the case of a "slow process," the lower than expected voltage at CP OUT will cause current sourcing circuit 120 and current sinking circuit 122 to source and sink less current for the particular phase adjustment. In both cases, the phase adjustment characteristics of current sourcing circuit 120 and current sinking circuit 122 more closely track the gain of current controlled oscillator 74. Second VCO 16 is thereby made more immune to manufacturing variations possible in present day semiconductor processes. Second VCO 16 may be incorporated into systems which comprise multiple VCOs and in which it is important that each VCO behave similarly. Multi-processor ("MP") data processing systems are one example of such a system.

Delay Matched Network

Ordinarily, two circuit paths may be delay matched by replicating the circuits present in the first path to the second path and vice versa, "dummy circuits." The various inputs to the dummy circuits are tied to constant voltage levels to ensure that the functionality of the path is not changed. For instance, if a first path contains a multiplexer which the second path does not contain, then the multiplexer is added to the second path. The output of the original second path is connected to one input of the dummy multiplexer and this input is always selected as the output of the multiplexer. Dummy circuit delay matching techniques may not be used in the case of distribution network 28. Here, a dummy cell would require too much area and would consume too much power.

The following description of delay matching network 24 is for a particular semiconductor process. However, the method may be applied to a wide variety of circuits to achieve the same results. The depicted embodiment is a CMOS process.

The power consumption of a CMOS circuit path is dominated by the circuit's capacitance, (C), its operating voltage, (V), and its operating frequency (f):

$$\text{Power} = CV^2 f \qquad \text{Eq. 1}$$

Therefore, the power consumption of delay matched network 24 can be reduced by a factor N relative to the power consumption of distribution network 28 by reducing the capacitance and load of delay matched network 24 relative to the capacitance of distribution network 28:

$$C_1 = C_2/N \qquad \text{Eq. 2}$$

where the subscript "1" references delay matched network 24 and the subscript "2" references distribution network 28. However, this simple reduction in capacitance will not result in equal propagation delays through the two networks. Therefore, a separate propagation delay analysis is required.

The propagation delay ($\tau$) through delay matched network 24 or through distribution network 28 is proportional to the circuit's capacitance, its resistance, (R), to the voltage difference across the capacitor, ($\Delta V$), and to the current used to charge the capacitor, (I):

$$\tau \propto RC + C\Delta V/I \qquad \text{Eq. 3}$$

Equations 2 and 3 must be solved simultaneously to produce a solution that satisfies both power and timing goals. Substituting Equation 2 into Equation 3 then produces the equality:

$$R_1 C_2/N + C_2 \Delta V_{1\partial/1} N = R_2 C_2 + C_2 \Delta V_2/I_2 \qquad \text{Eq. 4}$$

where the subscripts are as defined above, or $$R_1 C_2/N + C_2 \Delta V_{1\partial/1} N = R_2 C_2 + C_2 \Delta V_1/I_2 \qquad \text{Eq. 5}$$

since $\Delta V_1$ equals $\Delta V_2$. One solution of equation 5 requires that the first and third terms are equal and that the second and fourth terms are equal. This solution requires that the current through delay matched network 24 must be reduced by a factor N relative to the current through distribution network 28. With that replacement, equation 5 reduces further:

$$R_1 C_2/N = R_2 C_2 \qquad \text{Eq. 6}$$

or, $$R_1 = R_2 N \qquad \text{Eq. 7.}$$

Therefore, equations 2 and 7 govern the design of delay matched network 24. Such a constrained network will consume a N times less power than does distribution network 28 but will delay a signal propagating through it equally as does distribution network 28. Equation 2 specifies the capacitance of inverters 38 and 40 and distributed RC 42. The capacitance of inverters 38 and 40 may be reduced by a factor N relative to the capacitance of inverters 32 and 34 by reducing the width of the transistors by the factor N. The capacitance of distributed RC 42 must also be reduced by a factor N relative to the distributed RC 36. However, equation 9 specifies that the resistance of the distributed RC 42 must increase by a factor N relative to distributed RC 36.

One skilled in the art can design various conductive elements having specific capacitances and resistances. This design process can be based upon the theoretical properties of conductive elements or upon the practical results of the fabrication process used to manufacture PLL 10.

In theory, the capacitance of a conductive element is proportional to the product of its length and width. The resistance of a conductive element is proportional to the ratio of its length to its width. Therefore, the capacitance and resistance of distributed RC 42 may be matched to the capacitance and resistance of distributed RC 36 as specified by equations 2 and 9 by also satisfying these relationships.

In practice, one skilled in the art can create a table listing the capacitances and resistances of a variety of conductive elements as a function of their length and width. Therefore, the capacitance and resistance of distributed RC 42 may be matched to the capacitance and resistance of distributed RC 36 by extracting the capacitance and resistance of distributed RC 36 from the table, converting the extracted data pursuant to equations 2 and 9, and searching the table for a conductive element with the new properties. In one embodiment of PLL 10, each level of the H-tree comprising distributed RC 36 is delay matched with a separate piece of conductor in distributed RC 42.

Switching and Divide-By Logic Unit

Figure 4:
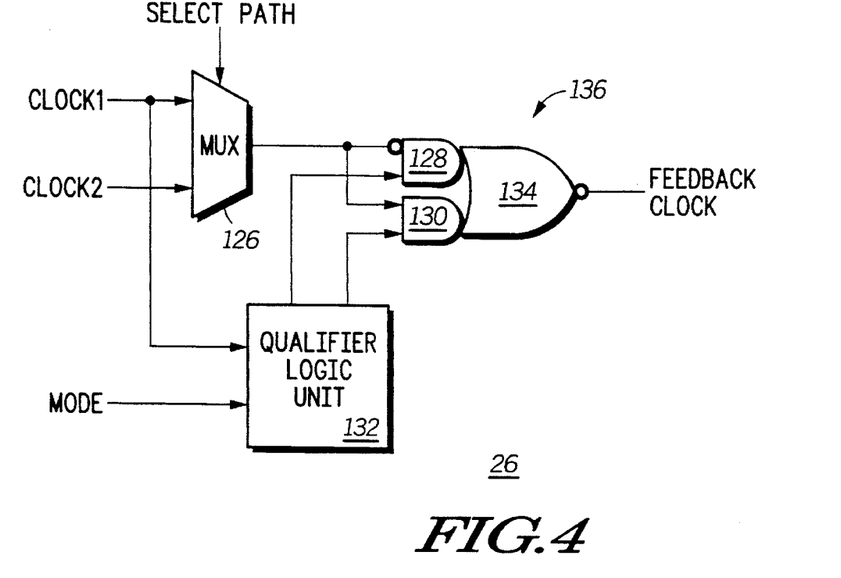
FIG. 4 depicts a schematic diagram of the switching and divide-by logic illustrated in FIG. 1.

FIG. 4 depicts a schematic diagram of switching and divide-by logic unit 26 illustrated in FIG. 1. A first input of a multiplexer 126 receives the output of the delay matched network 24, CLOCK1. A second input of multiplexer 126 receives the output of the distribution network 28, CLOCK2. The control signal SELECT PATH from COP 22 selects one of the two inputs as the output of multiplexer 126. The output of multiplexer 126 is connected to an inverting input of a first AND gate 128 and to a first input of a second AND gate 130. A first control signal generated by a qualifier logic unit 132 is connected to a non-inverting input of first AND gate 128. A second control signal generated by qualifier logic unit 132 is connected to the second input of second AND gate 130. An output of first AND gate 128 and an output of second AND gate 130 are connected to a first and a second input of an NOR gate 134. An output of NOR gate 134 generates FEEDBACK CLOCK. Logic gates 128, 130 and 134 are commonly referred to as an and-or-invert ("AOI") gate 136.

Qualifier logic unit 132 receives CLOCK1 and a MODE control signal(s). The control signal(s) MODE indicates the ratio of FEEDBACK CLOCK:CLOCK1. It may be generated from the output of a special purpose register accessible to the user (not shown) or may be connected to an external pin of PLL 10. The output control signals of qualifier logic unit 132 in conjunction with AOI gate 136 mask certain portions of the output of multiplexer 126 and certain portions of the logical complement of the output of multiplexer 126. The slower frequency of FEEDBACK CLOCK cause phase/frequency detector 12 to increase the frequency of VCO OUT. PLL 10 can thereby match the phase and frequency of REFERENCE CLOCK to a multiple of REFERENCE CLOCK. The divide-by functions of switching and divide-by logic unit 26 are not necessary to practice the disclosed invention. However, application for U.S. Patent entitled "Apparatus and Method for Generating a Phase-Controlled Clock Signal," attorney docket number AT9-94-024, U.S. Ser. No. 08/228/470, filed Apr. 15, 1994 and incorporated herein by reference, describes novel divide-by functions which may be incorporated into PLL 10. Other circuits, such as serially cascaded flip-flops, may perform this same divide-by function.

Chip Onboard Processor

Figure 5:
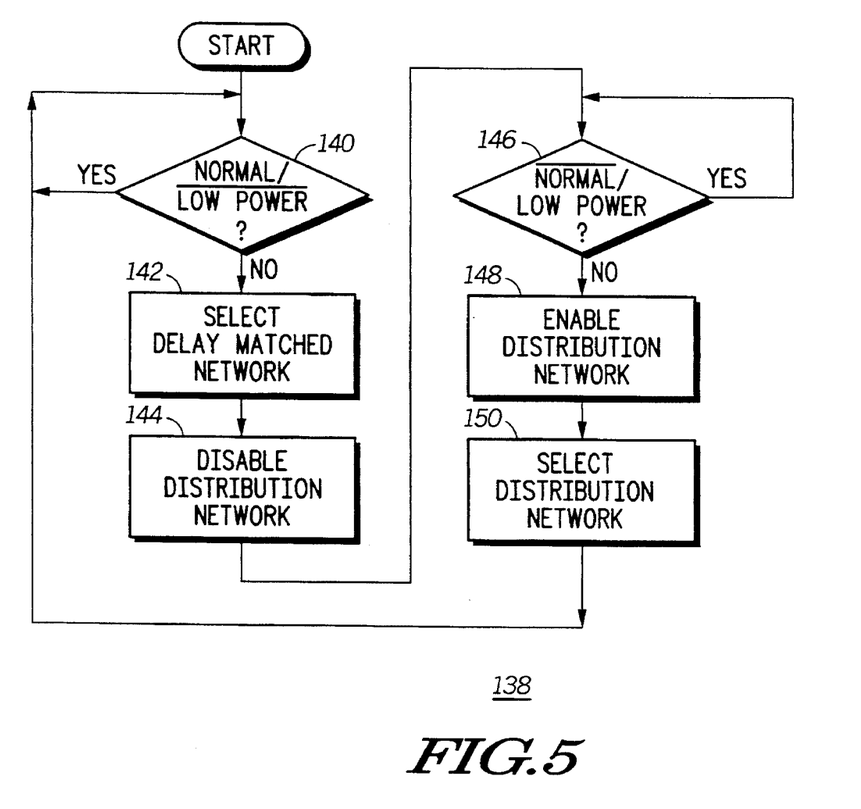
FIG. 5 depicts a flow chart of the operation of the chip onboard processor illustrated in FIG. 1.

FIG. 5 depicts a flow chart 138 of the operation of COP 22 illustrated in FIG. 1. After reset, PLL 10 is designed to enable both feedback paths and to feedback CLOCK2. COP 22 first determines if the circuit in which PLL 10 is integrated is in a normal or low power mode, a step 140. If the circuit in which PLL 10 is integrated is in a normal mode, then PLL 10 remains as configured and loops through step 140. COP 22 branches to a step 142 once it determines that it should enter the low power mode. COP 22 first asserts the control signal SELECT PATH, selecting the output of delay matched network 24 as the FEEDBACK CLOCK, step 142. Next, COP 22 inputs a constant voltage level to distribution network 28 through multiplexer 20, a step 144. The depicted embodiment is fabricated using a complementary metal oxide semiconductor ("CMOS") process. CMOS circuits consume no or negligible power when un-clocked. COP 22 again determines if the circuit in which PLL 10 is integrated is in the normal or low power mode, a step 146. If the circuit in which PLL 10 is integrated is in a low power mode, then PLL 10 remains as configured and loops through step 146. COP 22 branches to a step 148 once it determines that it should exit the low power mode. COP 22 first outputs VCO OUT to the distribution network via multiplexer 20, a step 148. Next, COP 22 de-asserts the control signal SELECT PATH, selecting the output of distribution network 28 as the FEEDBACK CLOCK, step 150. COP 22 then branches back to step 140. The described method ensures that PLL 10 does not select CLOCK2 before it routes VCO OUT through distribution network 28.

Although the present invention has been described with reference to a specific embodiment, further modifications and improvements will occur to those skilled in the art. It is to be understood therefore, that the invention encompasses all such modifications that do not depart from the spirit and scope of the invention as defined in the appended claims.

What is claimed is:

1. A resistorless voltage controlled oscillator comprising:
   a capacitor comprising a first terminal and a second terminal, the first terminal receiving an input voltage level, the second terminal receiving a first voltage supply;
   a first transistor comprising a first current electrode, a second current electrode and a control electrode, the first current electrode receiving the first voltage supply, the control electrode coupled to the first terminal of the capacitor, the second terminal coupled to an intermediate node;
   a current sourcing circuit coupled to the intermediate node, the current sourcing circuit sourcing current to the intermediate node responsive to a first control signal;
   a current sinking circuit coupled to the intermediate node, the current sinking circuit sinking current from the intermediate node responsive to a second control signal; and
   a current controlled oscillator coupled to the intermediate node, the current controlled oscillator generating a periodic clocking signal responsive to the current sourced at the intermediate node.

2. The resistorless voltage controlled oscillator of claim 1 wherein the current sourcing circuit comprises:
   a first constant current source comprising a first and a second terminal, the first terminal receiving the first voltage supply;
   a second transistor comprising a first current electrode, a second current electrode and a control electrode, the first current electrode receiving a second voltage supply, the second current electrode and the control electrode coupled to the second terminal of the first constant current source;
   a third transistor comprising a first current electrode, a second current electrode and a control electrode, the first current electrode coupled to the intermediate node, the control electrode coupled to the control electrode of the second transistor;

a fourth transistor comprising a first current electrode, a second current electrode and a control electrode, the first current electrode receiving the second voltage supply, the second current electrode coupled to the second current electrode of the third transistor, the control electrode receiving the first control signal; and wherein the current sinking circuit comprises:

a second constant current source comprising a first and a second terminal, the first terminal receiving the second voltage supply;

a fifth transistor comprising a first current electrode, a second current electrode and a control electrode, the first current electrode receiving the first voltage supply, the second current electrode and the control electrode coupled to the second terminal of the second constant current source;

a sixth transistor comprising a first current electrode, a second current electrode and a control electrode, the first current electrode coupled to the intermediate node, the control electrode coupled to the first current electrode and the control electrode of the fifth transistor;

a seventh transistor comprising a first current electrode, a second current electrode and a control electrode, the first current electrode receiving the first voltage supply, the second current electrode coupled to the second current electrode of the sixth transistor, the control electrode receiving the second control signal.

3. The resistorless voltage controlled oscillator of claim 2 wherein the current controlled oscillator comprises a first ring oscillator generating the periodic clocking signal responsive to the current sourced at the intermediate node.

4. The resistorless voltage controlled oscillator of claim 3 wherein the current controlled oscillator further comprises a second ring oscillator generating a logical complement of the periodic clocking signal responsive to the current sourced at the intermediate node.

5. The resistorless voltage controlled oscillator of claim 1 wherein the current sourcing circuit comprises:

a second transistor comprising a first current electrode, a second current electrode and a control electrode, the first current electrode receiving the first voltage supply, the control electrode coupled to the control electrode of the first transistor;

a third transistor comprising a first current electrode, a second current electrode and a control electrode, the first current electrode receiving a second voltage supply, the second current electrode and the control electrode coupled to the second current electrode of the second transistor;

a fourth transistor comprising a first current electrode, a second current electrode and a control electrode, the first current electrode coupled to the intermediate node, the control electrode coupled to the control electrode of the third transistor;

a fifth transistor comprising a first current electrode, a second current electrode and a control electrode, the first current electrode receiving the second voltage supply, the second current electrode coupled to the second current electrode of the fourth transistor, the control electrode receiving the first control signal; and wherein the current sinking circuit comprises:

a sixth transistor comprising a first current electrode, a second current electrode and a control electrode, the first current electrode coupled to the intermediate node, the control electrode coupled to the control electrode of the first transistor;

a seventh transistor comprising a first current electrode, a second current electrode and a control electrode, the first current electrode receiving the first voltage supply, the second current electrode coupled to the second current electrode of the sixth transistor, the control electrode receiving the second control signal.

6. The resistorless voltage controlled oscillator of claim 5 wherein the current controlled oscillator comprises a first ring oscillator generating the periodic clocking signal responsive to the current sourced at the intermediate node.

7. The resistorless voltage controlled oscillator of claim 6 wherein the current controlled oscillator further comprises a second ring oscillator generating a logical complement of the periodic clocking signal responsive to the current sourced at the intermediate node.

8. The resistorless voltage controlled oscillator of claim 1 wherein the current controlled oscillator comprises a first ring oscillator generating the periodic clocking signal responsive to the current sourced at the intermediate node.

9. The resistorless voltage controlled oscillator of claim 8 wherein the current controlled oscillator further comprises a second ring oscillator generating a logical complement of the periodic clocking signal responsive to the current sourced at the intermediate node.

10. A system comprising:

a phase/frequency detector receiving a reference clock signal and a feedback clock signal, the phase/frequency detector generating a first control signal and a second control signal responsive to a phase and frequency relationship of the reference clock signal and a feedback clock signal;

a charge pump coupled to the phase/frequency detector, the charge pump generating an output voltage responsive to the first and second control signals;

a voltage controlled oscillator coupled to the charge pump and to the phase/frequency detector, the voltage controlled oscillator generating the feedback clock signal, the voltage controlled oscillator comprising:

a capacitor comprising a first terminal and a second terminal, the first terminal receiving said output voltage, the second terminal receiving a first voltage supply;

a first transistor comprising a first current electrode, a second current electrode and a control electrode, the first current electrode receiving the first voltage supply, the control electrode coupled to the first terminal of the capacitor, the second terminal coupled to an intermediate node;

a current sourcing circuit coupled to the intermediate node, the current sourcing circuit sourcing current to the intermediate node responsive to the first control signal;

a current sinking circuit coupled to the intermediate node, the current sinking circuit sinking current from the intermediate node responsive to the second control signal; and a current controlled oscillator coupled to the intermediate node, the current controlled oscillator generating the feedback clock signal responsive to the current sourced at the intermediate node.

11. The system of claim 10 wherein the current sourcing circuit comprises:

a first constant current source comprising a first and a second terminal, the first terminal receiving the first voltage supply;

a second transistor comprising a first current electrode, a second current electrode and a control electrode, the first current electrode receiving a second voltage supply, the second current electrode and the control electrode coupled to the second terminal of the first constant current source;

a third transistor comprising a first current electrode, a second current electrode and a control electrode, the first current electrode coupled to the intermediate node, the control electrode coupled to the control electrode of the second transistor;

a fourth transistor comprising a first current electrode, a second current electrode and a control electrode, the first current electrode receiving the second voltage supply, the second current electrode coupled to the second current electrode of the third transistor, the control electrode receiving the first control signal; and wherein the current sinking circuit comprises:

a second constant current source comprising a first and a second terminal, the first terminal receiving the second voltage supply;

a fifth transistor comprising a first current electrode, a second current electrode and a control electrode, the first current electrode receiving the first voltage supply, the second current electrode and the control electrode coupled to the second terminal of the second constant current source;

a sixth transistor comprising a first current electrode, a second current electrode and a control electrode, the first current electrode coupled to the intermediate node, the control electrode coupled to the first current electrode and the control electrode of the fifth transistor;

a seventh transistor comprising a first current electrode, a second current electrode and a control electrode, the first current electrode receiving the first voltage supply, the second current electrode coupled to the second current electrode of the sixth transistor, the control electrode receiving the second control signal.

12. The system of claim 11 wherein the current controlled oscillator comprises a first ring oscillator generating the feedback clock signal responsive to the current sourced at the intermediate node.

13. The system of claim 12 wherein the current controlled oscillator further comprises a second ring oscillator generating a logical complement of the feedback clock signal responsive to the current sourced at the intermediate node.

14. The system of claim 10 wherein the current sourcing circuit comprises:

a second transistor comprising a first current electrode, a second current electrode and a control electrode, the first current electrode receiving the first voltage supply, the control electrode coupled to the control electrode of the first transistor;

a third transistor comprising a first current electrode, a second current electrode and a control electrode, the first current electrode receiving a second voltage supply, the second current electrode and the control electrode coupled to the second current electrode of the second transistor;

a fourth transistor comprising a first current electrode, a second current electrode and a control electrode, the first current electrode coupled to the intermediate node, the control electrode coupled to the control electrode of the third transistor;

a fifth transistor comprising a first current electrode, a second current electrode and a control electrode, the first current electrode receiving the second voltage supply, the second current electrode coupled to the second current electrode of the fourth transistor, the control electrode receiving the first control signal; and wherein the current sinking circuit comprises:

a sixth transistor comprising a first current electrode, a second current electrode and a control electrode, the first current electrode coupled to the intermediate node, the control electrode coupled to the control electrode of the first transistor;

a seventh transistor comprising a first current electrode, a second current electrode and a control electrode, the first current electrode receiving the first voltage supply, the second current electrode coupled to the second current electrode of the sixth transistor, the control electrode receiving the second control signal.

15. The system of claim 14 wherein the current controlled oscillator comprises a first ring oscillator generating the feedback clock signal responsive to the current sourced at the intermediate node.

16. The system of claim 15 wherein the current controlled oscillator further comprises a second ring oscillator generating a logical complement of the feedback clock signal responsive to the current sourced at the intermediate node.

17. The system of claim 10 wherein the current controlled oscillator comprises a first ring oscillator generating the feedback clock signal responsive to the current sourced at the intermediate node.

18. The system of claim 17 wherein the current controlled oscillator further comprises a second ring oscillator generating a logical complement of the feedback clock signal responsive to the current sourced at the intermediate node.

* * * * *